(12) United States Patent
Jenne et al.

(10) Patent No.: US 7,859,904 B1
(45) Date of Patent: Dec. 28, 2010

(54) THREE CYCLE MEMORY PROGRAMMING

(75) Inventors: Fredrick B. Jenne, Sunnyvale, CA (US); Cynthia Ratnakumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 167 days.

(21) Appl. No.: 12/234,528

(22) Filed: Sep. 19, 2008

Related U.S. Application Data (60) Provisional application No. 60/994,816, filed on Sep. 20, 2007.

(51) Int. Cl.
*G11C 16/00* (2006.01)

(52) U.S. Cl. .............................. 365/185.18; 365/185.28; 365/185.29

(58) Field of Classification Search .................... 365/195
See application file for complete search history.

(56) References Cited

U.S. PATENT DOCUMENTS

| | | | | |
|---|---|---|---|---|
| 5,909,392 A * | 6/1999 | Chang et al. | ............ | 365/185.12 |
| 6,483,752 B2 * | 11/2002 | Hirano | .................. | 365/185.33 |
| 6,493,280 B2 * | 12/2002 | Mihnea et al. | ............... | 365/218 |
| 6,507,522 B2 * | 1/2003 | Lee et al. | .................. | 365/185.3 |
| 6,661,707 B2 * | 12/2003 | Choi et al. | ............. | 365/185.17 |
| 6,834,012 B1 * | 12/2004 | He et al. | ................. | 365/185.18 |
| 7,075,828 B2 * | 7/2006 | Lue et al. | ............... | 365/185.24 |
| 7,397,701 B2 * | 7/2008 | Yeh et al. | ............... | 365/185.18 |
| 2010/0002515 A1 * | 1/2010 | Lutze et al. | ............ | 365/185.17 |

* cited by examiner

*Primary Examiner*—Tan T. Nguyen

(57) ABSTRACT

Methods include performing a soft bulk programming operation in the memory array in a first cycle, performing a bulk erase operation in the memory array in a second cycle and, in a third cycle, selectively inhibiting one or more memory cells in the memory array while applying a programming voltage to the memory array.

18 Claims, 15 Drawing Sheets

THREE CYCLE MEMORY PROGRAMMING

This application claims the benefit of the filing date of U.S. Provisional Patent Application No. 60/994,816, filed on Sep. 20, 2007, which is incorporated herein by reference in its entirety.

TECHNICAL FIELD

Embodiments of the present invention relate to nonvolatile semiconductor memory and, in particular, to three cycle memory programming.

BACKGROUND

SONOS (silicon-oxide-nitride-oxide-silicon) is a type of nonvolatile trapped-charge semiconductor memory technology. A SONOS memory cell can be fabricated as an N-type or P-type MOSFET (metal-oxide-semiconductor field effect transistor) with additional layers of oxide between the channel and the gate.

In its intrinsic state, the SONOS transistor operates like a conventional IGFET. The device is normally off (nonconductive) when a voltage ($V_{Ds}$) is applied between the drain and source terminals. If a voltage of the proper polarity and magnitude (the "threshold" voltage, $V_{TH}$) is applied between the gate and source terminals, the device may turn on and conduct current between the drain and source ($I_{Ds}$). The intrinsic threshold voltage is negative for a P-type device and positive for an N-type device. The intrinsic threshold voltage of a SONOS device is a function of the impurity (dopant) levels in the channel region. For an NSONOS device with typical dopant levels, the intrinsic threshold voltage, $V_{TH}$, is typically in the range of 0.4 to 0.8 volts. However, data retention in such a device may still break down over time.

BRIEF DESCRIPTION OF THE DRAWINGS

Embodiments of the present invention are illustrated by way of example and not limitation in the figures of the accompanying drawings, in which.

DETAILED DESCRIPTION

Methods and apparatus for cycling memory devices, such as nonvolatile charge trap memories are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

In accordance with certain embodiment of the present invention, the nonvolatile charge trap memory device is a SONOS-type device wherein charge-trapping layer is an insulating layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials and may utilize other material layers.

Figures 1A, 1B, 1C, 1D:
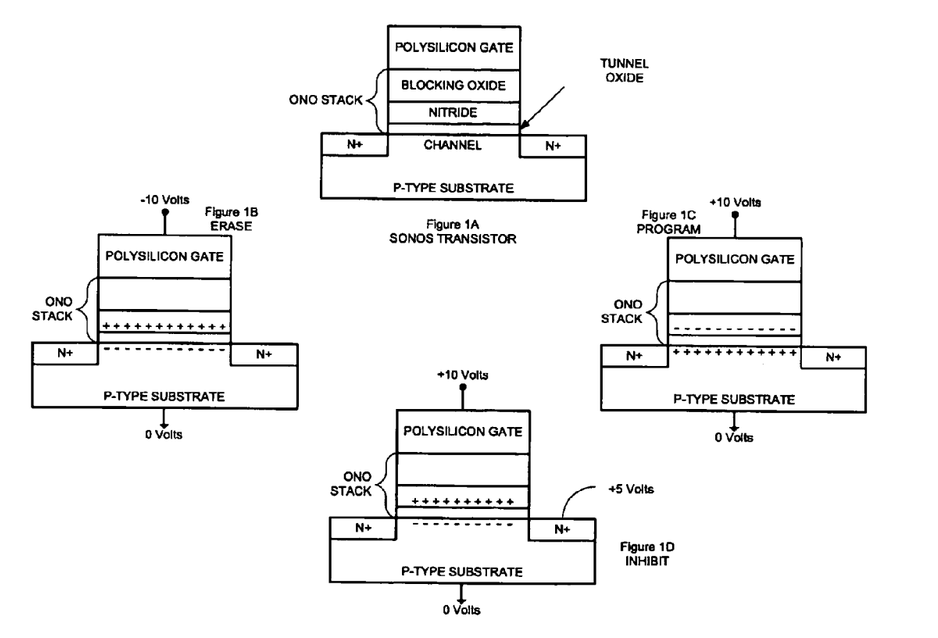
FIG. 1A illustrates the structure of a SONOS transistor, in accordance with an embodiment of the present invention.
FIG. 1B illustrates a SONOS erase configuration, in accordance with an embodiment of the present invention.
FIG. 1C illustrates a SONOS program configuration, in accordance with an embodiment of the present invention.
FIG. 1D illustrates a SONOS inhibit configuration, in accordance with an embodiment of the present invention.

FIG. 1A illustrates the cross-section of an exemplary SONOS transistor, based on an N-type, in accordance with an embodiment of the present invention. The SONOS transistor includes a P-type silicon substrate with N+ source and drain diffusions that define the limits of a channel region. Immediately above the channel is a thin layer of oxide approximately 2 nm thick, known as the tunnel oxide layer. Immediately above the tunnel oxide layer is a nitride layer approximately 100 nm thick. Immediately above the nitride layer is another oxide layer approximately 3 to 10 nm thick, known as the blocking oxide layer. Together, the tunnel oxide layer, the nitride layer and the blocking oxide layer are known as the ONO stack. Immediately above the blocking oxide layer is a control gate, which is typically made from polysilicon.

An NSONOS memory cell may be programmed and erased using a quantum mechanical effect known as Modified Fowler-Nordheim tunneling. FIG. 1B illustrates how a SONOS memory cell is erased, in accordance with an embodiment of the present invention. A negative voltage (e.g., −10V) is applied to the gate electrode. The resulting electric field between the gate and the substrate causes holes to tunnel from the substrate through the thin tunnel oxide layer where they are trapped in the nitride layer. When the erase voltage is removed, the holes that are trapped in the nitride layer attract electrons to the channel, which inverts the normally P-type channel. The inverted channel allows the transistor to conduct current between the drain and source in the presence of an applied voltage, even when the gate-to-source voltage is less than $V_T$. The device can be turned off by applying a negative gate-to-source voltage to repel electrons from the channel. In effect, the trapped holes lower the threshold voltage from the intrinsic threshold voltage $V_T$ to an erased threshold voltage $V_{TE}$. The state of the memory cell can be read by setting $V_{GS}$ to zero and applying a voltage (e.g., 1 volt) from drain to source and sensing the current that flows through the cell. If the current is greater than some predetermined value, then the cell may be recognized as erased. The erased state may be associated with a logic state (e.g., a logical "0").

FIG. 1C illustrates how a SONOS memory cell is programmed, in accordance with an embodiment of the present invention. A positive voltage (e.g., +10V) is applied to the gate electrode. The resulting electric field between the gate and the substrate causes electrons to tunnel from the substrate through the thin tunnel oxide layer where they are trapped in the nitride layer. When the programming voltage is removed, the electrons that are trapped in the nitride layer repel electrons from the channel and induce a positive space charge in the P-type channel. The electron depleted channel forms P-N junctions with the N+ source and drain diffusions. In this state, the transistor may not conduct current from drain to source in the presence of an applied drain-to-source voltage, even if $V_{GS}$ is at the intrinsic threshold voltage, because one of the P-N junctions may be reversed biased regardless of the polarity of the applied voltage. The device can be turned on by applying a gate-to-source voltage greater than $V_T$ to attract electrons to the channel. In effect, the electrons trapped in the nitride layer raise the threshold voltage from the intrinsic threshold voltage $V_T$ to a programmed threshold voltage $V_{TP}$. The state of the memory cell can be read by setting the gate-to-source voltage to zero and applying a voltage (e.g., 1 volt) from drain to source and sensing the current that flows through the cell. If the current is less than some predetermined maximum leakage value, then the cell may be recognized as programmed. The programmed state may be associated with a logic state (e.g., a logical "1").

Figure 2:
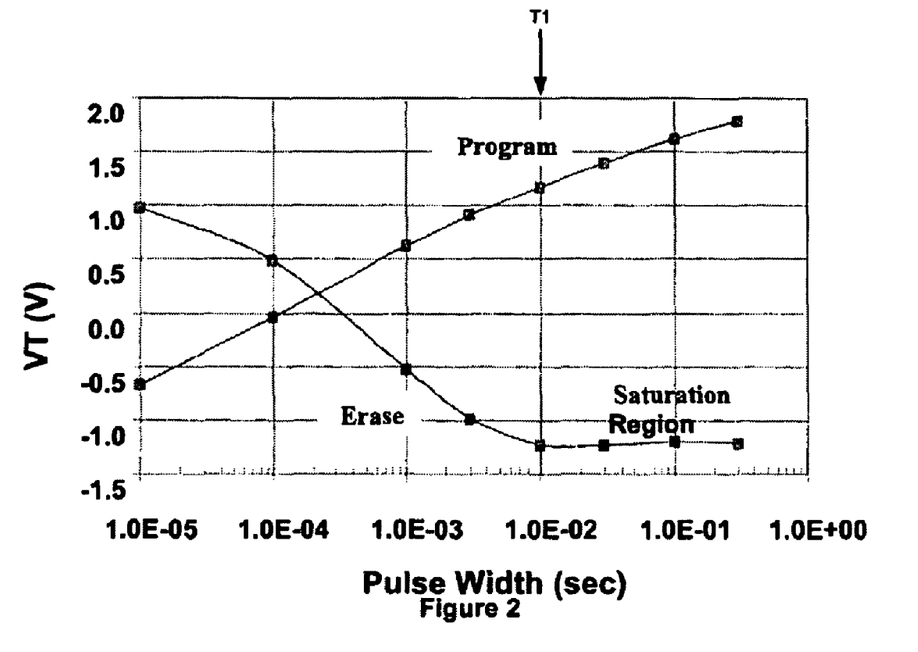
FIG. 2 illustrates SONOS threshold voltage transitions during program and erase operations, in accordance with an embodiment of the present invention.

The programming and erase operations are time dependent, with the duration of a program or erase pulse determining the amount of trapped charge that establishes the state of the cell. FIG. 2 illustrates how the threshold voltage of an exemplary SONOS memory device changes with time under an applied programming or erase voltage, in accordance with an embodiment of the present invention. As illustrated in FIG. 2, a programming pulse applied to an erased device raises the threshold voltage with time (as more electrons tunnel into the nitride layer), while an erase pulse applied to a programmed device lowers the threshold voltage (as more holes tunnel into the nitride layer). Typically, a pulse width of 10 ms is used to program or erase the cell, as illustrated by T1 in FIG. 2.

Like some other types of memory (e.g., floating gate flash memory) SONOS memory may be controlled with a combination of row-select (e.g., word select) commands and/or operations and bit-select commands and/or operations. A write operation in SONOS memory typically includes a bulk erase (BE) operation followed by a program or inhibit operation. The bulk erase operation places all of the SONOS cells in a selected row in an erased ("0") state. Then, cells that are to be programmed (written to a "1" state) are exposed to a programming pulse, while cells that are to remain erased (written to a "0" state) are inhibited from programming. The inhibiting is accomplished by applying an inhibiting voltage to those cells in the row that are to remain in the "0" or erased state. FIG. 1D illustrates a SONOS memory cell in an inhibit configuration, in accordance with an embodiment of the present invention. In FIG. 1D, a positive voltage (e.g., +5V) is applied to the drain of the SONOS transistor before the +10V programming pulse is applied. This positive voltage reduces the electric field across the tunnel oxide when the programming pulse is applied, inhibiting electrons from tunneling through the tunnel oxide layer and changing the state of the cell. In practice, the inhibiting voltage is not 100% effective, so that the threshold voltage of the inhibited cell undergoes a very small increase during the programming pulse, but not nearly enough to change the state of the cell.

Figure 3:
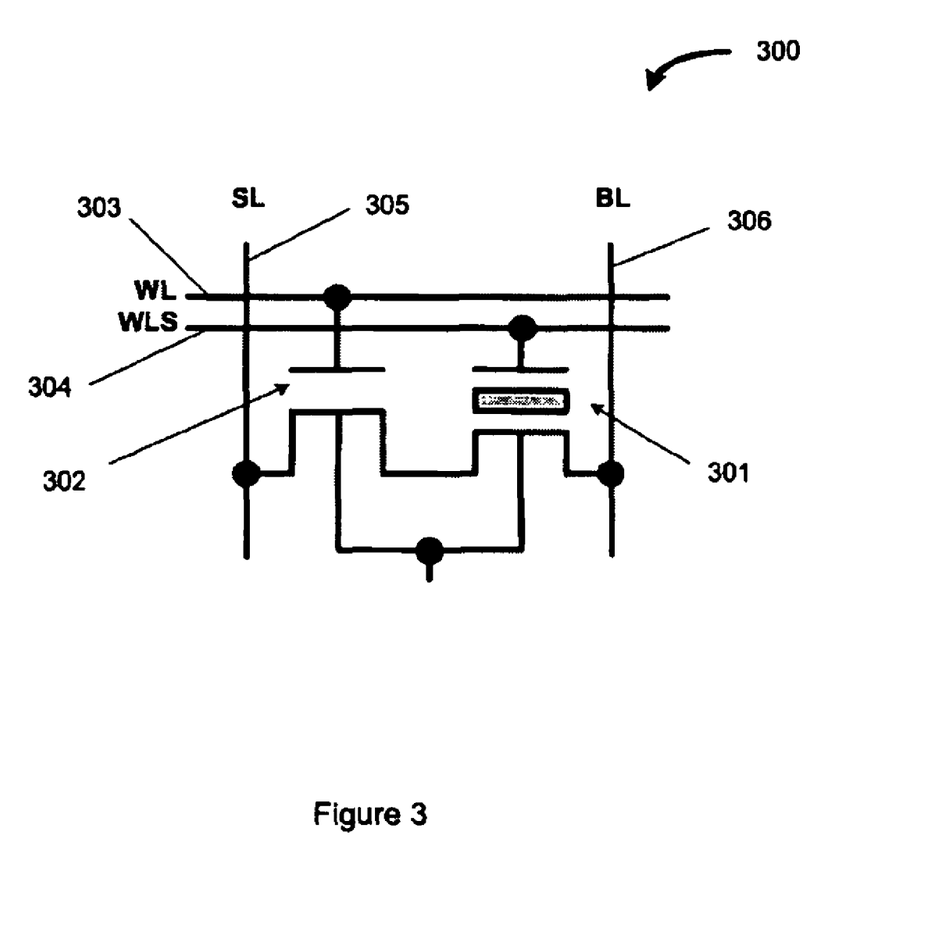
FIG. 3 illustrates a 2-transistor SONOS memory cell in one embodiment.

FIG. 3 illustrates a two-transistor (2T) SONOS memory cell 300, which includes a SONOS device 301 and a MOSFET pass transistor 302, in accordance with an embodiment of the present invention. The 2T SONOS memory cell may be part of a large array of similar cells in rows and columns. Each pass transistor in a row shares a common word line (WL) 303 and each SONOS device in a row shares a common SONOS word line (WLS) 304. Each pass transistor in a column shares a common source line (SL) 305 and each SONOS device in a column shares a common bit line (BL) 306. The SONOS word line (WLS) 304, connected to the gate of the SONOS device, is used to program and erase the SONOS device. The word line (WL) 303 is used to select the cell for a read operation as described above, where a read voltage is impressed across the bit line (BL) 306 and the source line (SL) 305. Otherwise, the WL voltage is held at zero volts to keep the pass transistor turned off. The source line (SL) 305 is normally left floating during program and erase operations. The bit line (BL) 306 is normally grounded for a program or erase operation or held at a positive voltage to inhibit the cell from programming as described above.

Figure 4:
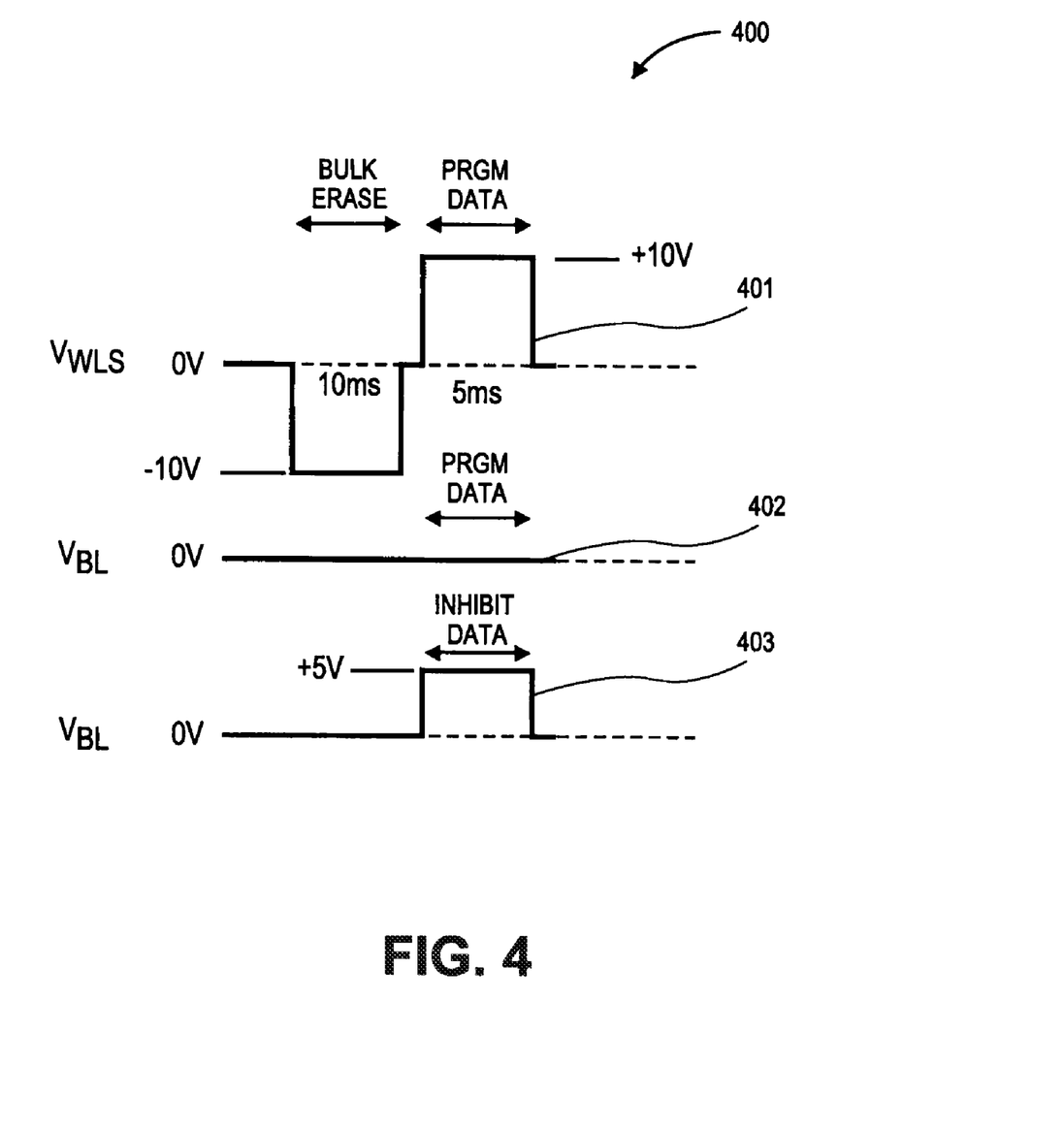
FIG. 4 illustrates 2-cycle SONOS programming, in accordance with an embodiment of the present invention.

FIG. 4 illustrates a waveform family 400 for a writing scheme for the memory cell of FIG. 3, in accordance with an embodiment of the present invention. Waveform 401 in FIG. 4 illustrates the voltage sequence ($V_{WLS}$) on the SONOS word line 304 and waveforms 402 and 403 illustrate the voltage on the bit line ($V_{BL}$) 306 for program and inhibit operations, respectively. As shown in FIG. 4, the bulk erase voltage pulse (−10 volts) is applied for approximately 10 milliseconds and is followed by a programming pulse (+10 volts) for approximately 5 milliseconds.

Figure 5:
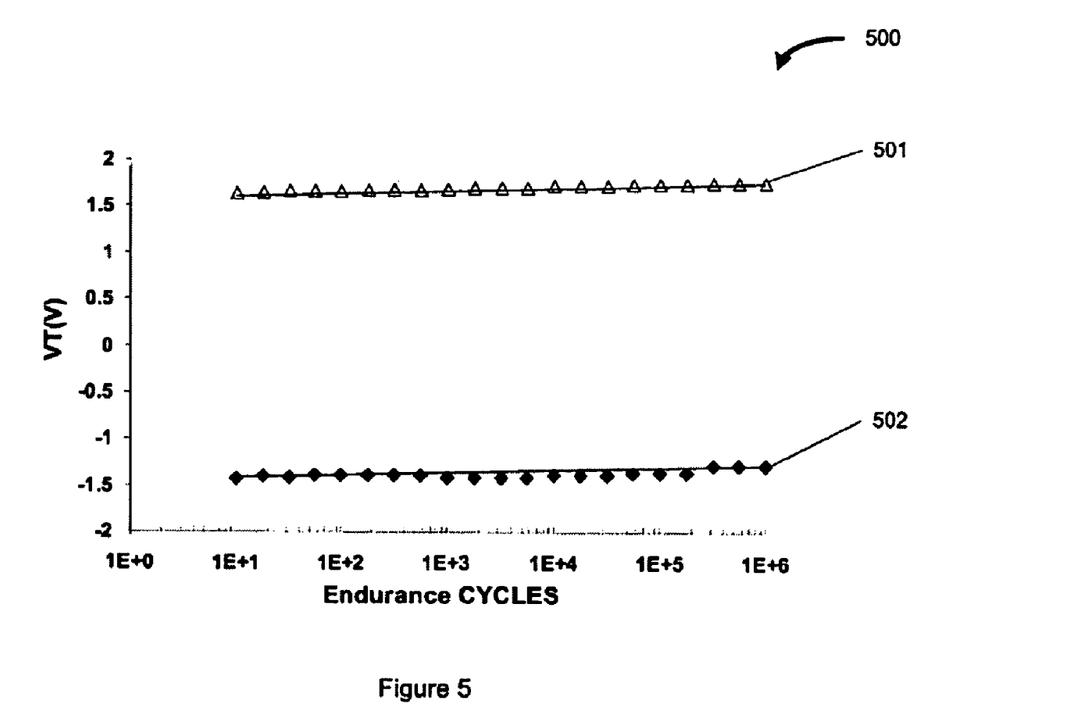
FIG. 5 illustrates threshold voltage shifts during endurance cycling of a SONOS device resulting from 2-cycle programming, in accordance with an embodiment of the present invention.

The reliability of non-volatile memory devices is measured by endurance (number of programming/erase cycles before failure) and data retention (length of time the cell can maintain a programmed or erased data state). A SONOS device "fails" if the difference between the erased threshold voltage and the programmed threshold voltage falls below a specified minimum value (e.g., 0.5 volts). In the 2-cycle writing method, back streaming electrons accelerated by the erase voltage cause damage to the tunnel oxide layer that result in the formation of trapping sites at the tunnel oxide interfaces with the channel and the nitride layer. One effect of these traps is a shift in threshold voltages as the device is cycled through program and erase operations. FIG. 5 illustrates this effect on an exemplary SONOS device as the device is cycled over one million times. FIG. 5 is a graph 500 illustrating an upward shift of both the programmed threshold voltage (501) and the erased threshold voltage (502), indicating that electrons are accumulating in traps at the tunnel oxide interfaces, in accordance with an embodiment of the present invention.

Figure 6:
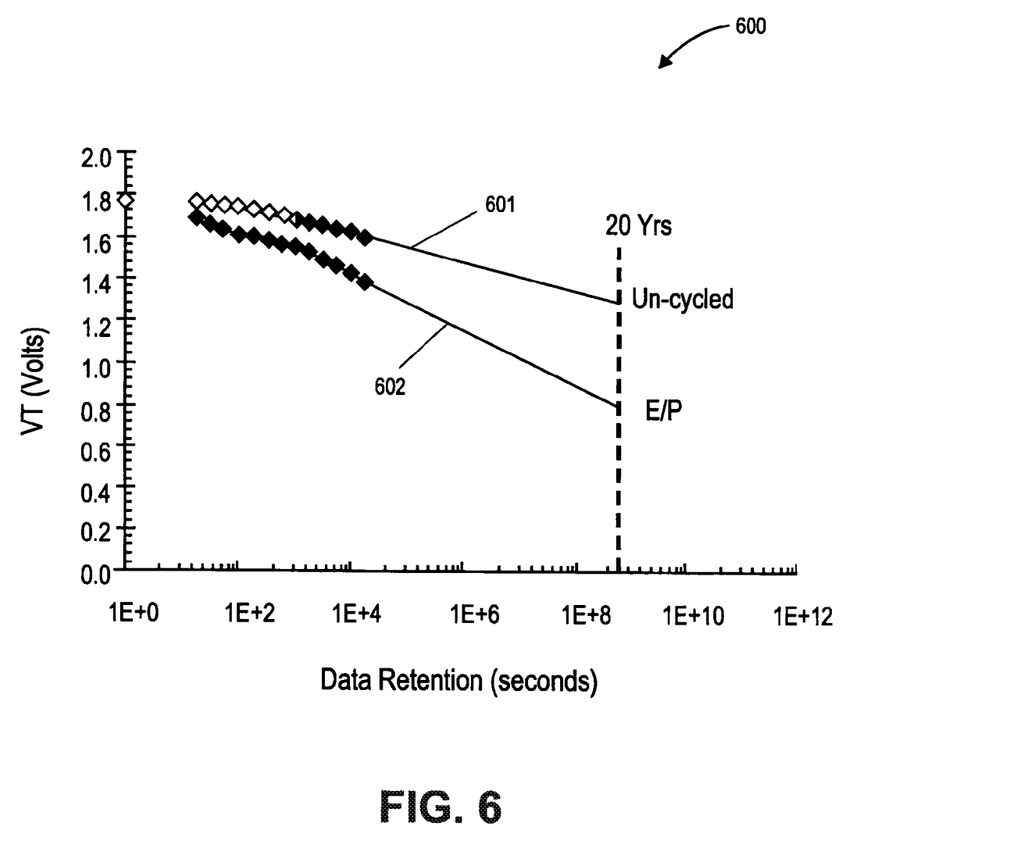
FIG. 6 illustrates data retention of a SONOS device after 2-cycle endurance cycling, in accordance with an embodiment of the present invention.

FIG. 6 illustrates the effect of the 2-cycle erase-program (E/P) write method on data retention, in accordance with an embodiment of the present invention. In FIG. 6, trace 601 illustrates the decay of the programmed state of an uncycled SONOS device, which has a decay rate of approximately 70 mv/decade and a projected threshold voltage of approximately 1.3 volts after 20 years. In contrast, trace 602 illustrates the decay rate of the same device after one million E/P endurance cycles, which is approximately 130 mv/decade and which decays to the intrinsic, un-programmed threshold voltage after 20 years. The decay of threshold voltage with time is caused by charge leakage from the trapping layer to the channel. The high rate of decay illustrated by trace 602 in FIG. 6 is indicative of trap assisted tunneling, which is a direct result of the damage caused by the 2-cycle write method. In trap assisted tunneling (TAT), the damage-induced traps at the tunnel oxide layer interfaces and those created in the nitride memory layer provide intermediate energy levels that allow charge to tunnel from the trapping layer to the channel at rates that are higher than in an undamaged device, thereby reducing data retention lifetime.

Figure 7:
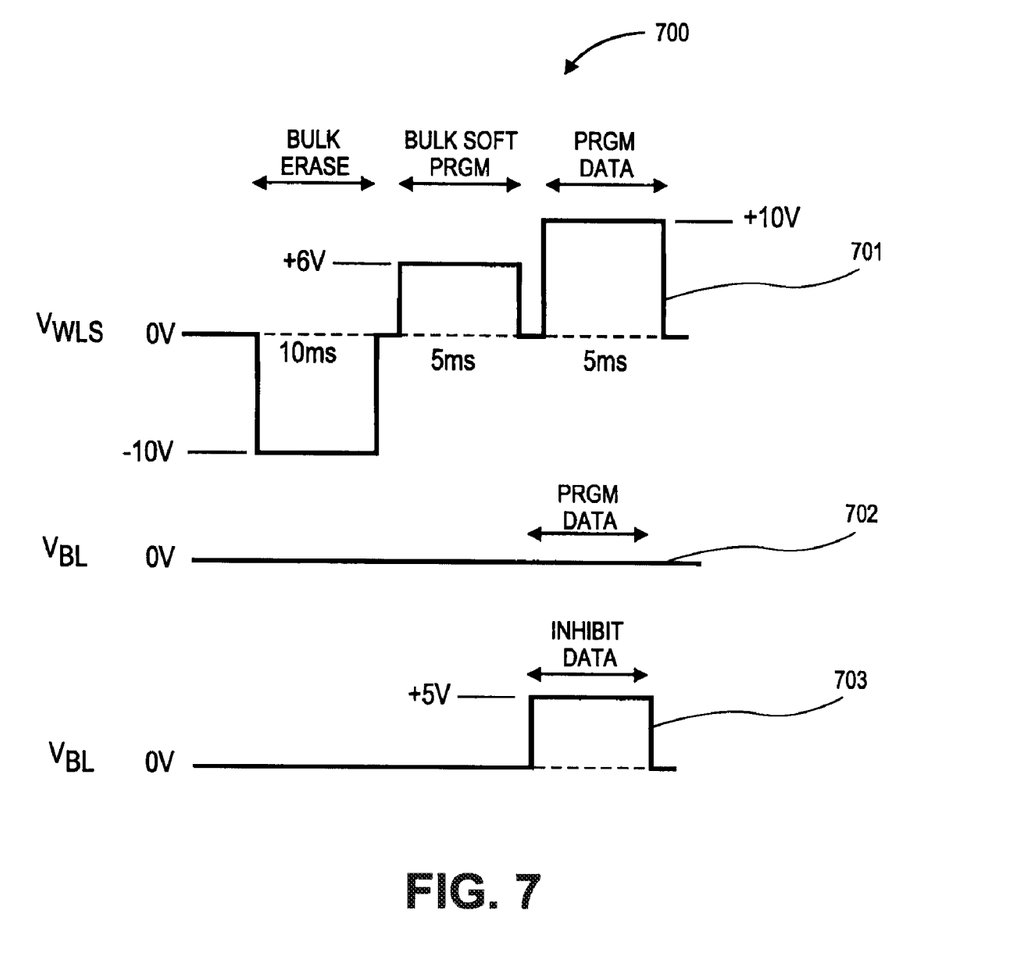
FIG. 7 illustrates one embodiment of 3-cycle SONOS programming.

One embodiment of the present invention includes a 3-cycle method for writing to SONOS memory as illustrated by the waveform family 700 in FIG. 7. In FIG. 7, waveform 701 illustrates the voltage $V_{WLS}$ on the SONOS word line 304 of memory cell 300. The first cycle of waveform 701 is a bulk erase (BE) cycle where memory cell 300 is erased to a "0" state. In one embodiment, the bulk erase pulse may have a magnitude of approximately −10 volts and a duration of approximately 10 ms. The second cycle of waveform 701 is a soft bulk programming (BSP) cycle where memory cell 300 is exposed to a programming voltage that is less than a conventional programming voltage. In one embodiment, the soft-programming pulse may have a magnitude of approximately +6 volts and a duration of approximately 5 ms. The third cycle of waveform 701 is a write (W) operation, where memory cell 300 is either programmed or inhibited as determined by the state of its bit-line described above. In one embodiment, the programming pulse may have a magnitude of approximately +10 volts and a duration of approximately 5 ms. Waveform 702 illustrates the bit line voltage $V_{BL}$ on bit line 306 of memory cell 300, when memory cell 300 is to written to a "1" state, where the difference between $V_{WLS}$ and $V_{BL}$ is approximately +10 volts. Waveform 703 illustrates the bit line voltage $V_{BL}$ on bit line 306 of memory cell 300, when memory cell 300 is to be inhibited (i.e., written to a "0" state), where the difference between $V_{WLS}$ and $V_{BL}$ is approximately +5 volts.

Figure 8:
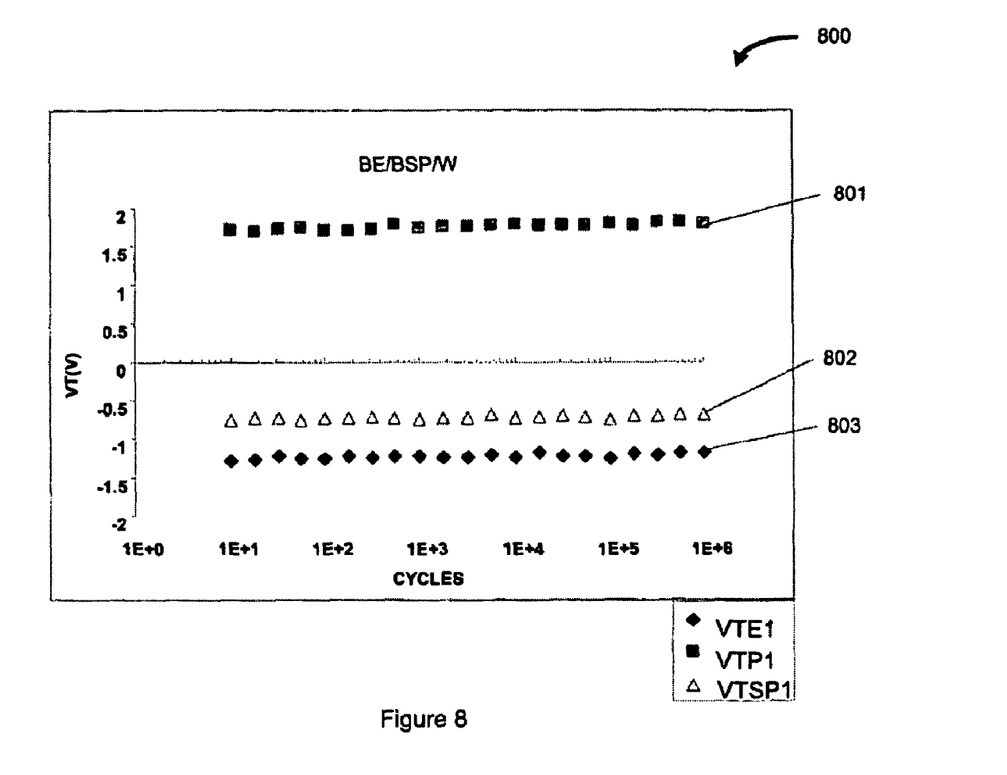
FIG. 8 illustrates threshold voltage shifts of a SONOS device under 3-cycle programming in one embodiment.
Figure 9:
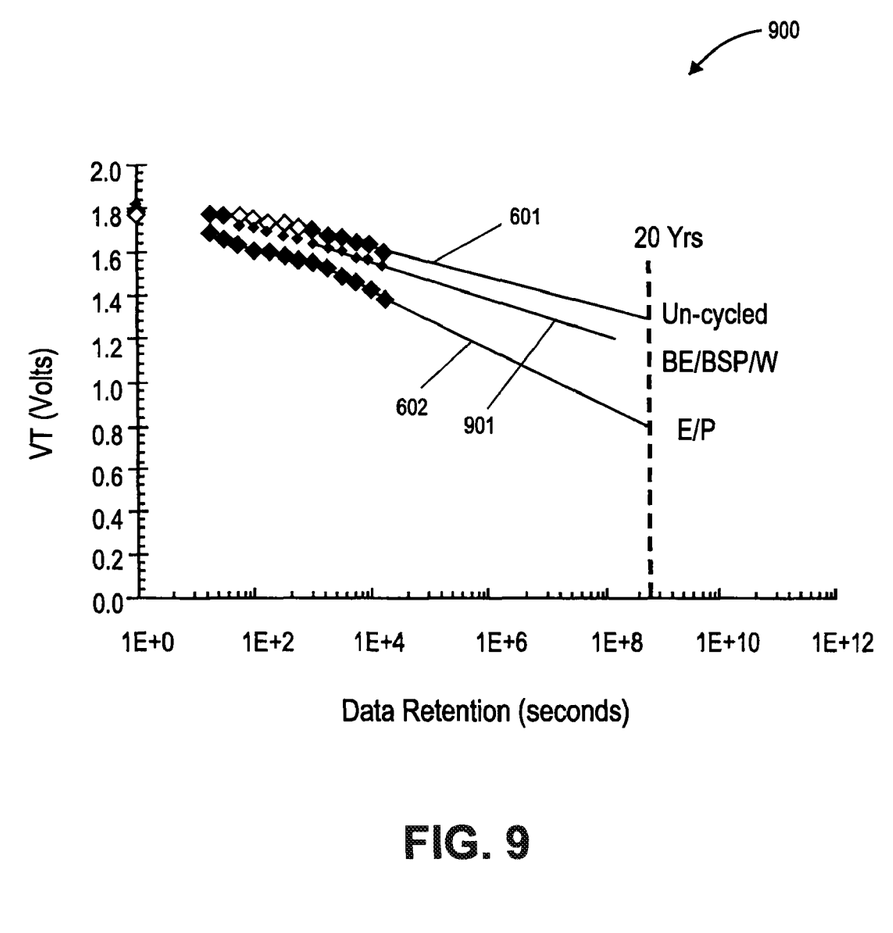
FIG. 9 illustrates data retention of a SONOS device after 3-cycle endurance cycling in one embodiment.

FIG. 8 is a graph 800 illustrating the effects of the above described 3-cycle (BE/BSP/W) method on the threshold voltages of an exemplary SONOS device after one million endurance cycles, in accordance with an embodiment of the present invention. It can be seen in FIG. 8 that the threshold shifts of the erased threshold voltage (diamonds 803), the programmed threshold voltage (squares 801) and the soft-programmed threshold voltage (triangles 802) are reduced in comparison with the effects of the 2-cycle method illustrated in FIG. 5, indicating a reduction in trap formation at the tunnel oxide layer interfaces. FIG. 9 is a graph 900 illustrating the effect of the 3-cycle method on data retention, in accordance with an embodiment of the present invention. In FIG. 9, trace 601 is repeated from FIG. 6 and illustrates the decay rate of an uncycled device (~70 mv/decade). Trace 602 is repeated from FIG. 6 and illustrates the decay rate of a cycle device (~130 mv/decade). Trace 901 is the decay rate for a device cycled using the 3-cycle BE/SBP/W method described above, which is approximately 80 mv/decade compared with 130 mv/decade for the method. The reduced decay rate is indicative of a reduction in trap assisted tunneling.

Figure 10:
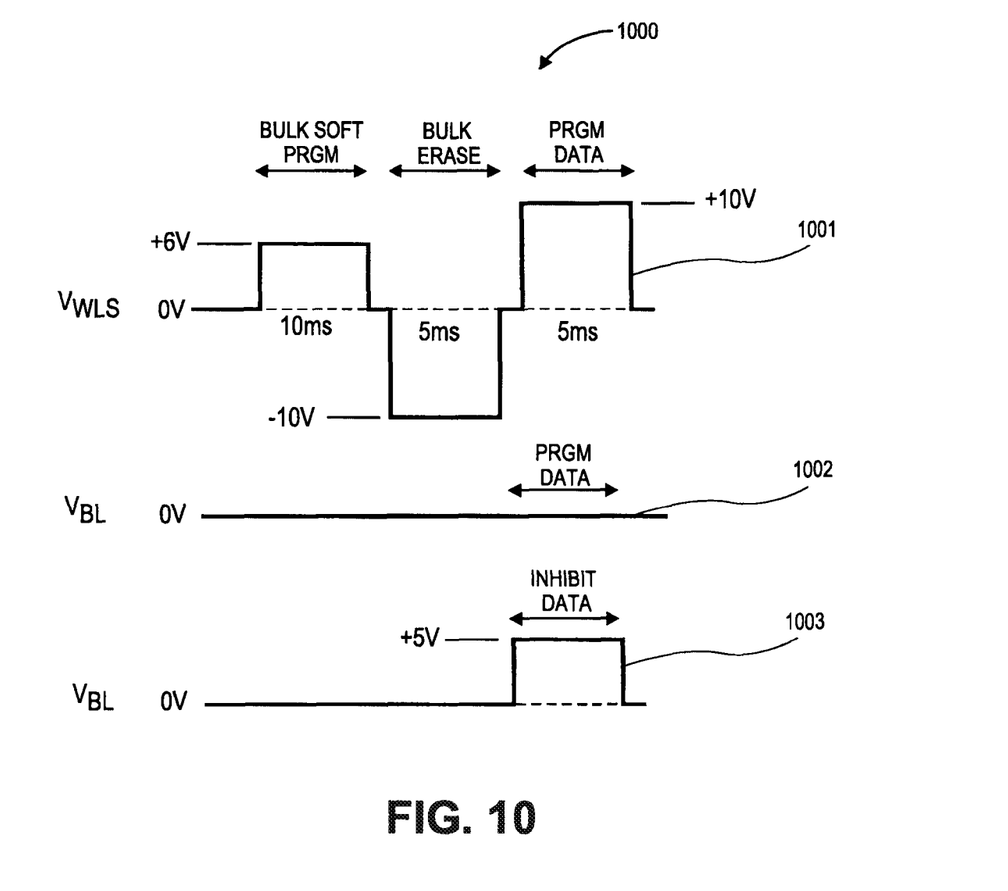
FIG. 10 illustrates another embodiment of 3-cycle SONOS programming.

Another embodiment of the present invention includes a second 3-cycle method for writing to SONOS memory, as illustrated in FIG. 10 by waveform family 1000. In this embodiment, the first cycle of the $V_{WLS}$ waveform 1001 is a soft bulk programming (BSP) cycle where the memory cell 300 is exposed to a programming voltage that is less than a conventional programming voltage. In one embodiment, the soft-programming pulse may have a magnitude of approximately +6 volts and a duration of approximately 10 ms. The second cycle of waveform 1001 is a bulk erase (BE) cycle, where memory cell 300 is erased to a "0" state. In one embodiment, the bulk erase pulse may have a magnitude of approximately −10 volts and a duration of approximately 5 ms. The third cycle of waveform 1001 is a write operation, where each cell is either programmed or inhibited, as determined by the state of its bit-line as described above and illustrated by waveforms 1002 and 1003. In one embodiment, the programming pulse of waveform 1001 may have a magnitude of approximately 10 volts and a duration of approximately 5 ms.

Figure 11:
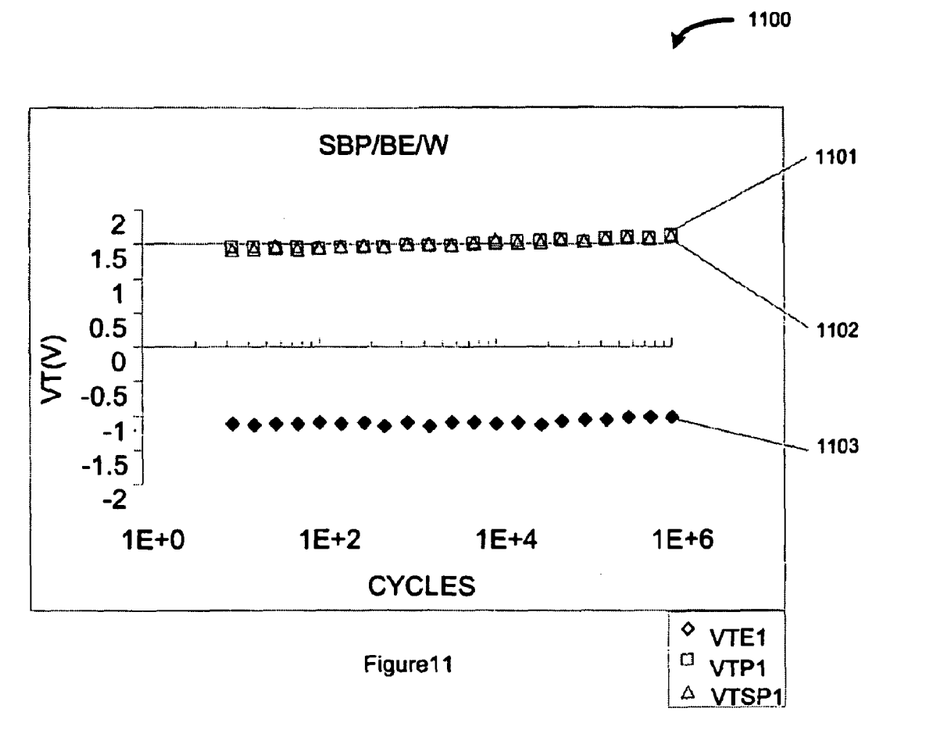
FIG. 11 illustrates threshold voltage shifts of a SONOS device under another embodiment of 3-cycle programming.
Figure 12:
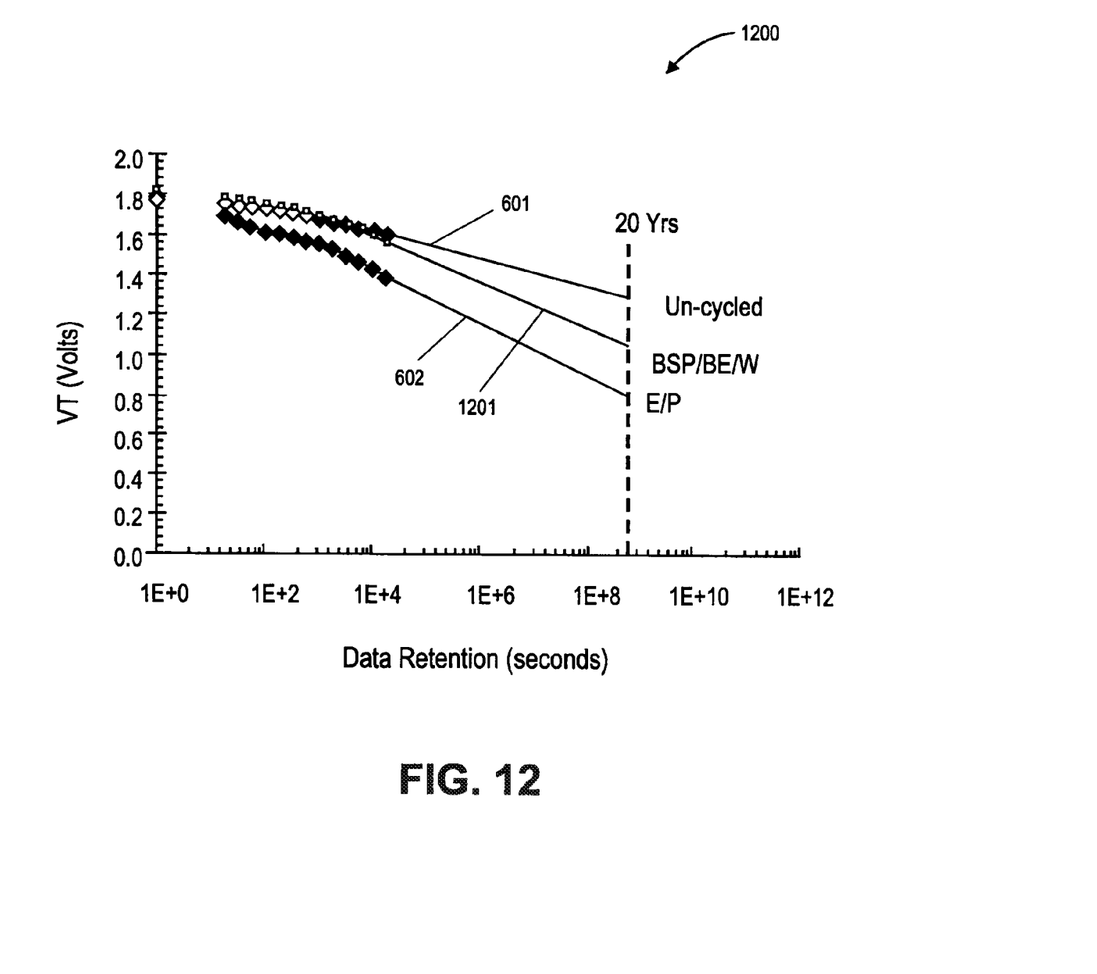
FIG. 12 illustrates data retention of a SONOS device after 3-cycle endurance cycling in another embodiment.

FIG. 11 is a graph 1100 illustrating the effects of the above described 3-cycle method on the threshold voltages of an exemplary SONOS device after one million endurance cycles, in accordance with an embodiment of the present invention. It can be seen in FIG. 11 that the threshold shifts of the erased threshold voltage (diamonds 1103), the programmed threshold voltage (squares 1102) and the soft-programmed threshold voltage (diamonds 1101) are reduced in comparison with the 2-cycle method, indicating a reduction in trap formation at the tunnel oxide layer interfaces. FIG. 12 is a graph 1200 illustrating the effect of the second 3-cycle method on data retention, in accordance with an embodiment of the present invention. In FIG. 12, the top trace 601 is again the decay rate of an uncycled device (~70 mv/decade) and the bottom trace 602 is the decay rate of a cycle device (~130 mv/decade), repeated from FIG. 6. Trace 1201 is the decay rate for a device cycled using the 3-cycle SBP/BE/P method described above, which is approximately 90 my/decade. The reduced decay rate is again indicative of a reduction in trap assisted tunneling.

Figure 13:
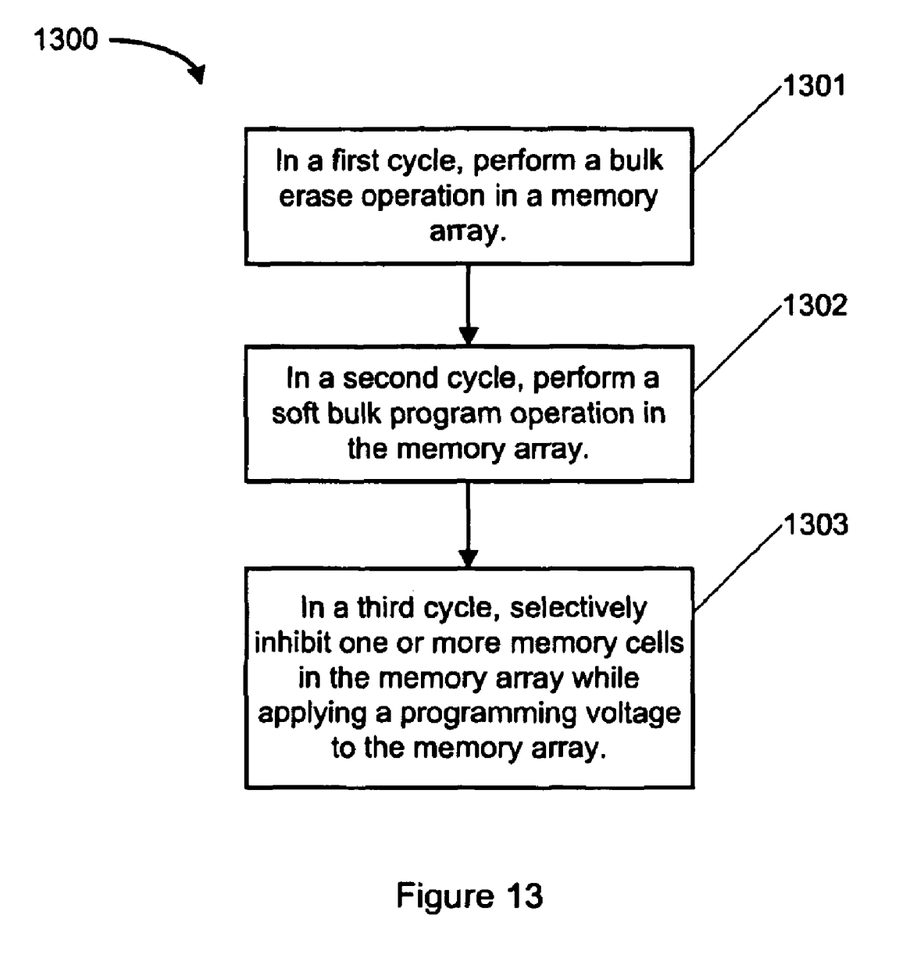
FIG. 13 is a flowchart illustrating a method of three-cycle SONOS programming in one embodiment.

FIG. 13 is a flowchart 1300 illustrating a method for three-cycle SONOS programming in one embodiment of the invention. Method 1300 includes: in a first cycle, performing a bulk erase operation in a memory array (operation 1301); in a second cycle, performing a soft bulk program operation in the memory array (operation 1302); and in a third cycle, selectively inhibiting one or more memory cells in the memory array while applying a programming voltage to the memory array (operation 1303).

Figure 14:
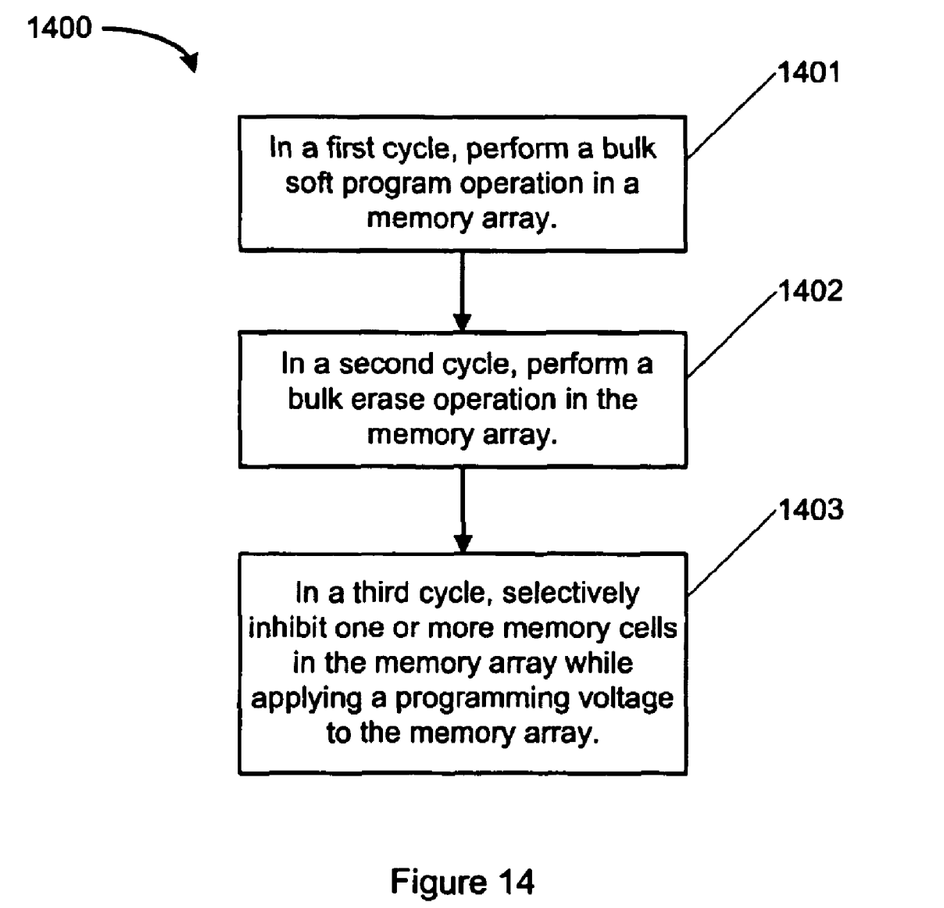
FIG. 14 is a flowchart illustrating a method of three-cycle SONOS programming in another embodiment.

FIG. 14 is a flowchart 1400 illustrating another method for three-cycle SONOS programming in one embodiment of the invention. Method 1400 includes: in a first cycle, performing a soft bulk program operation in a memory array (operation 1401); in a second cycle, performing a bulk erase operation in the memory array (operation 1402); and in a third cycle, selectively inhibiting one or more memory cells in the memory array while applying a programming voltage to the memory array (operation 1403).

Figure 15:
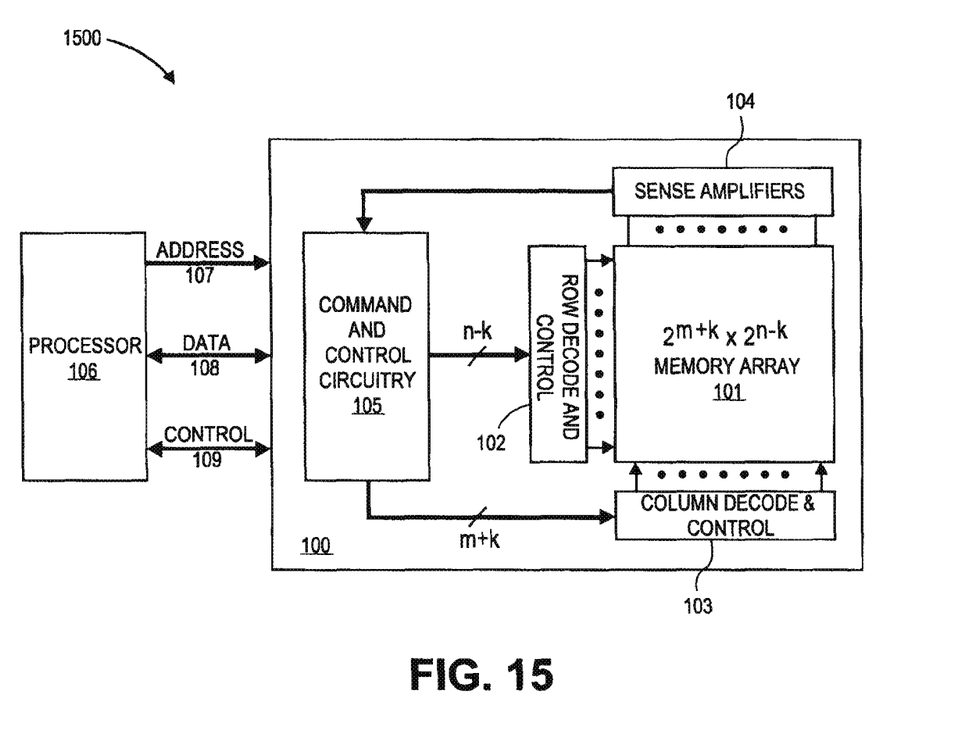
FIG. 15 is a block diagram illustrating a memory system in which embodiments of the invention may be implemented.

FIG. 15 is a block diagram of a processing system 1500 including a SONOS memory 100 according to one embodiment of the invention. In FIG. 15, the SONOS memory 100 includes a SONOS memory array 101, which may be organized as rows and columns of SONOS memory cells such as cell 300 described above. In one embodiment, memory array 101 may be an array of $2^{m+k}$ (columns by $2^{n-k}$ rows of memory devices where k is the length of a data word in bits. Memory array 101 may be coupled to a row decoder and controller 102 via $2^{n-k}$ word lines. Memory array 101 may also be coupled to a column decoder and controller 102 via $2^{m+k}$ source lines and by $2^{m+k}$ bit lines. Row and column decoders and controllers are known in the art and, accordingly, are not described in detail herein. Memory array 101 may also be coupled to a plurality of sense amplifiers 104 to read k-bit words from memory array 101. Memory 100 may also include command and control circuitry 105 to control row decoder and controller 102, column decoder and controller 103 and sense amplifiers 104, and also to receive read data from sense amplifiers 104.

Memory 100 may also be coupled to a processor 106 via an address bus 107, a data bus 108 and a control bus 109. Processor 106 may be any type of general purpose or special purpose processing device, for example. In one embodiment, row controller 102 may be configured to select a row of the memory array 101 for a write operation. The column controller 103 may be configured to select a memory cell in the row for programming. The row controller 102 and the column controller 103 may be configured to apply a bulk erase voltage to the memory cell in a first cycle, to apply a soft bulk program voltage to the memory cell in a second cycle and, in a third cycle, to selectively inhibiting the memory cell while applying a programming voltage to the memory array 101.

In another embodiment, row controller 102 may be configured to select a row of the memory array 101 for a write operation. The column controller 103 may be configured to select a memory cell in the row for programming. The row controller 102 and the column controller 103 may be configured to apply a soft bulk program voltage to the memory cell in a first cycle, to apply a bulk erase voltage to the memory cell in a second cycle and, in a third cycle, to selectively inhibiting the memory cell while applying a programming voltage to the memory array 101.

Although embodiments of the present invention have been described with reference to specific exemplary embodiments, it will be evident that various modifications and changes may be made to these embodiments without departing from the broader spirit and scope of embodiments of the invention as set forth in the claims. Accordingly, the specification and drawings are to be regarded in an illustrative rather than a restrictive sense.

What is claimed is:

1. A method, comprising:
    in a first cycle, performing a bulk erase operation in a memory array;
    in a second cycle, performing a soft bulk programming operation in the memory array; and
    in a third cycle, selectively inhibiting one or more memory cells in the memory array while applying a programming voltage to the memory array.

2. The method of claim 1, wherein the soft bulk programming operation comprises a reduced voltage program operation, a reduced pulse width program operation or a combination of a reduced voltage program operation and a reduced pulse width program operation.

3. The method of claim 1, wherein the memory array is a nonvolatile charge trap device memory array.

4. The method of claim 3, wherein the nonvolatile charge trap device is a SONOS-type device.

5. A method, comprising:
    in a first cycle, performing a soft bulk programming operation in a memory array;
    in a second cycle, performing a bulk erase operation in the memory array; and
    in a third cycle, selectively inhibiting one or more memory cells in the memory array while applying a programming voltage to the memory array.

6. The method of claim 5, wherein the soft bulk programming operation comprises a reduced voltage program operation, a reduced pulse width program operation or a combination of a reduced voltage program operation and a reduced pulse-width program operation.

7. The method of claim 5, wherein the memory array is a nonvolatile charge trap device memory array.

8. The method of claim 7, wherein the nonvolatile charge trap device is a SONOS-type device.

9. A system, comprising:
    a memory cell array; and
    a memory controller coupled with the memory array, wherein the memory controller is configured to select a memory cell of the memory for a write operation, wherein the memory controller is configured to perform a bulk erase operation on the memory cell in a first cycle, to perform a soft bulk programming operation on the memory cell in a second cycle and, in a third cycle, to selectively inhibit the memory cell from programming while applying a programming voltage to the memory array.

10. The system of claim 9, wherein performing the bulk erase operation on the memory cell comprises applying a reduced voltage programming voltage to the memory cell, applying a reduced programming pulsewidth to the memory cell or a combination of a reduced voltage and a reduced pulsewidth.

11. The system of claim 9, wherein the memory array is a nonvolatile charge trap device memory array.

12. The system of claim 11, wherein the nonvolatile charge trap device is a SONOS-type device.

13. A system, comprising:
    a memory cell array; and
    a memory controller coupled with the memory array, wherein the memory controller is configured to select a memory cell of the memory for a write operation, wherein the memory controller is configured to perform a soft bulk program operation on the memory cell in a first cycle, to perform a bulk erase operation on the memory cell in a second cycle and, in a third cycle, to selectively inhibit the memory cell from programming while applying a programming voltage to the memory array.

14. The system of claim 13, wherein performing the bulk erase operation on the memory cell comprises applying a reduced voltage programming voltage to the memory cell, applying a reduced programming pulsewidth to the memory cell or a combination of a reduced voltage and a reduced pulsewidth.

15. The system of claim 13, wherein the memory array is a nonvolatile charge trap device memory array.

16. The system of claim 15, wherein the nonvolatile charge trap device is a SONOS-type device.

17. An apparatus, comprising:
    a means for performing a bulk erase operation in a memory array in a first cycle;
    a means for performing a soft bulk programming operation in the memory array in a second cycle; and
    a means for selectively inhibiting one or more memory cells in the memory array while applying a programming voltage to the memory array in a third cycle.

18. The apparatus of claim 17, wherein the means for performing the soft bulk programming operation comprises a means for performing at least one of a reduced voltage program operation and a reduced pulse width program operation.

* * * * *